(12) United States Patent
Parkhe

(10) Patent No.: US 7,655,316 B2
(45) Date of Patent: Feb. 2, 2010

(54) CLEANING OF A SUBSTRATE SUPPORT

(75) Inventor: Vijay D. Parkhe, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 224 days.

(21) Appl. No.: 10/888,798

(22) Filed: Jul. 9, 2004

(65) Prior Publication Data

US 2006/0008660 A1 Jan. 12, 2006

(51) Int. Cl.
*B32B 15/08* (2006.01)

(52) U.S. Cl. .................. 428/458; 428/192; 428/336; 428/337; 428/339; 428/473.5; 428/689; 428/699; 428/701; 428/702; 428/426; 428/432; 428/325; 428/412; 428/446; 428/450; 428/457

(58) Field of Classification Search ................ 428/64.1, 428/66.2, 66.7, 192, 446, 457, 458; 15/104.001, 15/104.8, 244.1, 223; 279/128

See application file for complete search history.

(56) References Cited

U.S. PATENT DOCUMENTS

| | | | |
|---|---|---|---|
| 5,238,878 A | 8/1993 | Shinohara | |
| 5,507,874 A | 4/1996 | Su et al. | |
| 5,671,119 A | 9/1997 | Huang et al. | |
| 5,746,928 A | 5/1998 | Yen et al. | |
| 6,033,728 A | 3/2000 | Kikuchi et al. | |
| 6,171,980 B1 | 1/2001 | Crabtree et al. | |
| 6,559,026 B1 | 5/2003 | Rossman et al. | |
| 6,563,686 B2 | 5/2003 | Tsai et al. | |
| 6,715,524 B2 | 4/2004 | Chen et al. | |
| 2002/0153024 A1 | 10/2002 | Akiba | |
| 2003/0000547 A1* | 1/2003 | Carpenter et al. | 134/1.3 |
| 2003/0180532 A1* | 9/2003 | Namikawa et al. | 428/355 AC |
| 2005/0042958 A1* | 2/2005 | Namikawa et al. | 442/76 |

FOREIGN PATENT DOCUMENTS

| | | |
|---|---|---|
| JP | 011-87457 A | 7/1989 |
| JP | 04-256307 A | 9/1992 |
| JP | 07-142440 A | 6/1995 |
| JP | 08-321447 A | 12/1996 |
| JP | 10-154686 A | 6/1998 |
| JP | 10-321488 A | 12/1998 |
| JP | 11-224895 A | 8/1999 |

(Continued)

OTHER PUBLICATIONS

Van Landingham, "Review of Instrumented Indentation", J. Res. Natl. Inst. Stand. Techno., Jul.-Aug. 2003, v.108, 249-265, Nat'l Inst. of Standards and Tech, Gaithersburg, MD.

*Primary Examiner*—Ling Xu
(74) *Attorney, Agent, or Firm*—Janah & Associates, P.C.

(57) ABSTRACT

A cleaning wafer cleans process residues from a support surface used in the processing of a substrate in an energized gas. The cleaning wafer has a disc having a liquid precursor derived polyimide layer formed directly on the disc by applying a liquid polyimide precursor to the disc. The polyimide layer has a thickness of less than about 50 microns, and a cleaning surface shaped to match a contour of the support surface. Process residues adhere to the cleaning surface and are cleaned from the support surface upon removal of the cleaning wafer therefrom.

35 Claims, 2 Drawing Sheets

FOREIGN PATENT DOCUMENTS

| | | |
|---|---|---|
| JP | 2000228439 A | 8/2000 |
| JP | 2000260671 A | 9/2000 |
| JP | 2002-280365 A2 | 9/2002 |
| JP | 2003-115521 A2 | 4/2003 |
| WO | WO 01/94036 | 12/2001 |

* cited by examiner

CLEANING OF A SUBSTRATE SUPPORT

BACKGROUND

The present invention relates to a method and device for cleaning a surface of a substrate support.

In the fabrication of semiconductors and displays, material is formed or deposited on a substrate, such as a semiconductor wafer or dielectric, by processes such as chemical vapor deposition (CVD), physical vapor deposition (PVD), ion implantation, oxidation and nitridation. The material formed on the substrate can also be etched to define features of electric circuits and devices. Such processes are generally performed in a process chamber in which a plasma may be generated. The substrate is supported during these processes on a substrate support, such as an electrostatic chuck. The electrostatic chuck typically comprises a dielectric having a support surface that covers an electrode to which a voltage is applied. The applied voltage generates an electrostatic force that holds the substrate securely on the support surface during processing. An example of an electrostatic chuck is described in U.S. Pat. No. 6,563,686 to Tsai et al, filed on Mar. 19, 2001 and assigned to Applied Materials, which is herein incorporated by reference in its entirety. Other support surfaces in the chamber can comprise the surfaces of lift pins and substrate transports. The chamber also typically has enclosure walls about the substrate support, a gas distributor and exhaust, and a gas energizer.

In the processing of substrates, process residues can deposit on the surfaces of process kit parts such as shields. The process residues may be, for example, process by-products generated by etching or depositing material on the substrate. These process residues can accumulate on support surfaces, such as a substrate receiving surface of an electrostatic chuck, by "flaking off" from components such as the process kit and onto the support surface. Also, occasionally particles of silicon from wafer breaks in other chambers can be transported via the substrate transport into process chamber, and onto the surface of the electrostatic chuck. These particles and residues on the surface of the electrostatic chuck are undesirable, because they can reduce the magnitude of the electrostatic chucking force between the chuck and substrate. The reduced chucking force can cause slipping of the substrate on the electrostatic chuck during processing, and non-uniformity in the substrate processing results. Also, weakly held substrates may allow leakage of backside heat transfer gas, which can lead to non-uniform temperatures across the substrates. In some cases, large particles on the electrostatic chuck can even prevent the processing of further substrates, and can require venting of the process chamber to manually wipe the particles from the surface of the electrostatic chuck, which undesirably increases the chamber downtime and the cost of ownership.

In one version of a cleaning process, the surface of the support is rinsed in a cleaning solution to dissolve and wash away any residues the surface. However, conventional cleaning solutions can often erode chuck surfaces. Also, such processes can often require removal of the electrostatic chuck from the chamber, and venting of the chamber to atmospheric pressure, which can result in undesirable chamber downtime.

In another version, a dummy wafer is used to remove residues from the surface of the electrostatic chuck, as described for example in U.S. Pat. No. 5,746,928 to Yen et al., filed on Jun. 3, 1996, which is herein incorporated by reference in its entirety. In this version, the dummy wafer is placed on the chuck in a process chamber, and a voltage is applied to the chuck. Once the voltage is turned off, the dummy wafer is removed from the chuck along with debris and contamination that adhere to the backside of the dummy wafer. However, as the strength of adhesion of particles to the hard backside of the dummy wafer is limited, this method often does not provide sufficient cleaning of particles from the chuck surface, and may be especially problematic in the cleaning of larger particles. Also, such dummy wafers can also contaminate surfaces that are being cleaned by rubbing of the wafer material onto the surfaces.

Yet another version of a cleaning method is described in U.S. Pat. No. 5,671,119 to Huang et al, filed on Mar. 22, 1996, which is herein incorporated by reference in its entirety. In this version, a soft, particle adherent sheet is affixed to a dummy wafer, for example by vacuum grease, to assist in removing contaminant particles from an electrostatic chuck in an etching chamber. However, while the particles may exhibit improved adhesion to the soft sheet over the bare surface of the dummy wafer alone; this method still does not provide satisfactory results for the cleaning of support surfaces. In particular, the soft sheet attached by vacuum grease may not be suitable for the cleaning of process chambers that are typically operated at an ultra-high vacuum, such as deposition chambers operated at less than about $10^{-7}$ barr ($9.8 \times 10^{-7}$ atm), as the vacuum grease can contaminate the chamber. Also, the sheet held by the vacuum grease may not operate well at higher temperatures above room temperature, such as those typically used in processing chambers. Furthermore, the loosely held sheet may not adequately adhere to the dummy wafer, and it may be difficult to de-chuck the dummy wafer without also de-laminating the sheet. The poorly held sheet of material may also not provide sufficient electrostatic chucking forces between the chuck and dummy wafer, such that the layer is only weakly pressed against the particles on the surface of the chuck. Also, in general, the dummy wafers can have high particle counts and large numbers of chemical impurities. These particles and impurities can contaminate the soft sheets, for example during transport of the dummy wafers in close proximity to each other in cassettes.

Yet another version of a cleaning layer is described in WO 01/94036 to Namikawa et al, published on Dec. 13, 2001, which is herein incorporated by reference in its entirety. In this version, a cleaning sheet has a cleaning layer comprising a polymer on a base material, and is attached to a conveying member such as a semiconductor wafer by an adhesive layer. However, this embodiment is also problematic, as the adhesive layer can generate contamination in the process chamber, and the multiple layers of material can reduce the electrostatic chucking force. One or more of the multiple layers can also slip or de-laminate from the semiconductor wafer during the cleaning process, resulting in a poorer clean of the support surface.

Accordingly, it is desirable to have a method and tool for the cleaning of a support surface, such as an electrostatic chuck, substantially without requiring venting of the chamber. It is further desirable to have a method and tool that allows for the cleaning of a sufficient amount of particles, without requiring removal of the support from the process chamber. It is also desirable to have a method and tool that allows for the removal of particles from the chamber without dropping the particles in the chamber or otherwise causing contamination in the chamber.

SUMMARY

In one version, a cleaning wafer is provided that cleans process residues from a support surface used in the processing of a substrate in an energized gas. The cleaning wafer has a disc having a liquid precursor derived polyimide layer formed directly on the disc by applying a liquid polyimide precursor to the disc. The polyimide layer has a thickness of less than about 50 microns, and a cleaning surface shaped to match a contour of the support surface. Process residues adhere to the cleaning surface and are cleaned from the support surface upon removal of the cleaning wafer therefrom.

In yet another version of a cleaning wafer that cleans process residues from a support surface used in the processing of a substrate in an energized gas, the cleaning wafer has a disc having a polymer layer with a cleaning surface shaped to match a contour of the support surface, and an electrode about the polymer layer. The electrode is capable of being electrically charged to generate electrostatic forces to press the cleaning surface against the support surface. Process residues adhere to the cleaning surface and are cleaned from the support surface upon removal of the cleaning wafer therefrom.

In one version, a method of fabricating a cleaning wafer capable of cleaning process residues from a substrate support surface includes providing a cleaning disc, applying a liquid polyimide precursor to the cleaning disc to form a polyimide layer thereon, by spraying or spin coating the liquid polyimide layer onto the disc to form a polyimide precursor film on the disc, and curing the polyimide precursor film to form a polyimide layer.

In another version, a cleaning wafer to clean process residues from a support surface used in the processing of a substrate in an energized gas has a disc having first and second opposing sides. The cleaning wafer has a metal layer having a cleaning surface shaped to match a contour of the support surface. The cleaning wafer can also have a second metal layer on a second side of the disc. Process residues adhere to the cleaning surface and are cleaned from the support surface upon removal of the cleaning wafer therefrom.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
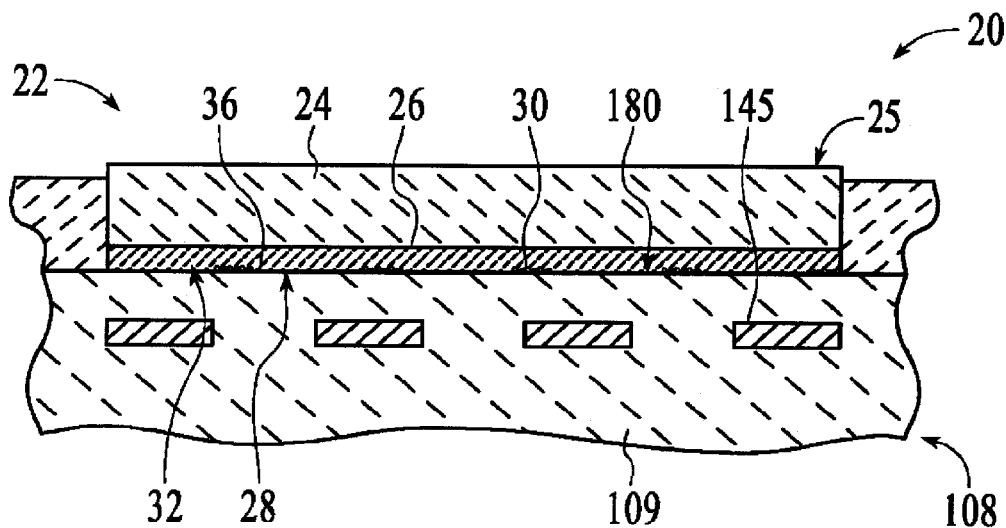
FIG. 1 is sectional side view of an embodiment a cleaning wafer on a support surface of an electrostatic chuck.

A cleaning tool 20 for cleaning the surface 180 of a substrate support 100 comprises a cleaning wafer 22, an embodiment of which is shown in FIG. 1. The cleaning wafer 22 may be suitable for cleaning a support 100 such as a vacuum chuck or an electrostatic chuck 108, which has a dielectric material 109 over an electrode 145 to electrostatically hold a substrate 104 in a process chamber 106. Other components that have support surface to support a substrate 104 may also be cleaned, such as for example a lift pin 152 or substrate transport 153. The cleaning wafer 22 comprises a disc 24 that has a polymer layer 26 thereon with a cleaning surface 28 that is capable of cleaning process residues 30 from the support surface 180. The cleaning surface 28 is desirably shaped and sized to substantially match a contour of the support surface 180. For example, the cleaning surface 28 may be substantially planar to allow the surface 28 to lie flush against flat portions of a support surface 180 that contact the substrates 104. Alternatively, the cleaning surface 28 may comprise ridges or furrows to match channels or pads in the support surface 180. The cleaning surface 28 also comprises a diameter or width that is sized to substantially match a diameter or width of the support surface 180, to allow good coverage of the support surface 180 by the cleaning surface 28.

The disc 24 is desirably composed of a material that is suitable for supporting the layer 26 of cleaning material. For example, the disc 24 may comprise a dielectric or semiconducting material, such as at least one of aluminum oxide, quartz, silicon, and polycarbonate. The disc 24 may also comprise a metal material, such as at least one of aluminum, an aluminum alloy, stainless steel and titanium. In one version, the disc 24 comprises a particle grade high quality silicon wafer that provides reduced particle contamination in a process chamber 106. The particle grade high quality silicon wafer may comprise, for example, less than about 50 particles having a size of at least about 0.2 microns on the surface 25 of the wafer. The particle grade high quality silicon wafer may also comprise a reduced level of metal contaminations, such as less than about $5 \times 10^{11}$ atoms/cm$^2$ of contaminant metal. While the cleaning wafer 22 may preferably comprise a disc 24 and polymer layer 26 having circular peripheries, it should be understood that the cleaning wafer 22 could also comprise other periphery shapes, such as square, triangular or rectangular shaped peripheries, to fit support surfaces 180 comprising more angular surfaces, such as support surfaces for flat panel displays.

The polymer layer 26 comprises a polymer having properties that promote the adhesion of process residues 30 to the cleaning surface 28. For example, the polymer layer 26 may comprise a polymer having optimized characteristics such as an optimized elastic modulus, hardness, and surface energy, such that the polymer layer 26 is capable of picking up and retaining particles of process residue. Pressing the cleaning surface 28 of the cleaning wafer 22 against the support surface 180 at least partially embeds the process residues 30 in the relatively soft polymer layer 26. When the cleaning wafer 22 is removed from the support surface 180, the adhered process residues 30 are lifted off of the support surface 180 to provide a cleaned support surface 180. In one version, a hardness of less than about 2 GPa and even less than about 1 GPa may be suitable, which can be measured by a hardness load and displacement indentation test, as described for example in *Review of Instrumented Indentation* in the *Journal of Research of the National Institute of Standards and Technology*, Vol. 108, No. 4, July-August 2003, which is herein incorporated by reference in its entirety. Also, a suitable elastic modulus may be at least about 0.98 N/mm$^2$ as determined according to JIS K7127. In another version, the polymer layer 26 comprises a surface free energy of less than about 30 mJ/m$^2$. Examples of properties that promote the adhesion of process residues and their measurements may be described in WO 01/94036 to Namikawa et al, published on Dec. 13, 2001, which is herein incorporated by reference in its entirety.

Yet another property that may be optimized is the heat resistance of the polymer layer 26. For example, the composition and properties of the polymer layer 26 may be optimized to withstand temperatures of up to about 400° C. under a vacuum pressure, such as from about 25° C. and even from about 150° C. to about 400° C. The heat resistant polymer layer 26 is desirable because the polymer layer 26 can be used to clean the support surface 180 while maintaining higher chamber temperatures such as those used during processing. Thus, the higher cleaning temperatures allow the cleaning process to be performed substantially without requiring cycling of the chamber temperatures between different processing and cleaning temperatures.

In one version, the polymer layer 26 comprises one or more polyimide polymers, which have been found to be suitable for the cleaning of process residues 30. Polyimides are polymers having an imide group (—CONRCO—) in the polymer chain, where R stands for H or a carbon containing group, such as a methyl group ($CH_3$) or aromatic ring. Examples of polyimides include linear polyimides and aromatic heterocyclic polyimides, such as Kapton® and Pyralin®, commercially available from Du Pont High Performance Films, Circleville Ohio, U.S.A. Polyimides provide the desired adhesion properties for removing process residues, and also exhibit good erosion resistance in high heat and vacuum environments.

The polyimide layer 26 is desirably derived from a liquid polyimide precursor that is applied directly to a bottom surface 32 of the disc 24 to form a precursor film, substantially without an intervening adhesion layer. The directly applied liquid polyimide precursor hardens on the surface 32 to provide a secure bond between the disc 24 and polyimide layer 26. The polyimide layer 26 can be formed by applying a liquid precursor comprising one or multiple types of polyimide precursors, and can also include other polymer precursors added to enhance the properties of the polyimide layer 26. The liquid polyimide precursor film may also be cured to cross-link the polyimide precursor and form the hardened polyimide layer 26, for example by heating the liquid polyimide precursor to a temperature of at least about 250° C. Other methods of curing can include exposing to the polyimide precursor to ultraviolet light or a chemical curing agent. In one version, the polyimide layer 26 can be formed by spin-coating a layer 26 of polyimide onto the surface 32. In a spin-coating process, the liquid polyimide precursor is provided onto a surface and the surface is rotated to provide an even coating. Examples of polyimide spin-coating processes are described in U.S. Pat. No. 6,171,980 to Crabtree et al, assigned to NEC Electronics, Inc, and issued on Jan. 9, 2001, U.S. Pat. No. 5,238,878 to Shinohara, assigned to NEC Corporation and issued on Aug. 24, 1993, and U.S. Pat. No. 6,033,728 to Kikuchi et al, assigned to Fujitsu Limited and issued on Mar. 7, 2000, all of which are herein incorporated by reference in their entireties. In another version, a spraying method is used to spray-coat the liquid polyimide precursor directly onto the bottom surface 32 of the disc 24 to form a sprayed polyimide layer 26.

The directly applied liquid polyimide precursor provides a polyimide layer 26 that provides good cleaning results even in high vacuum process chambers (less than about $10^{-7}$ barr), substantially without contaminating the chambers. Also, because the liquid precursor is directly applied, a strong bond is formed between the disc 24 and resulting polyimide layer 26 that allows the layer 26 to be pressed more firmly into the support surface 180 during cleaning, substantially without de-lamination of the polyimide layer 26 upon removal of the cleaning wafer 22 from the surface 180. Forming the polyimide layer 26 by applying the liquid polyimide precursor directly to the disc 24 also allows for the formation of a relatively thin polyimide layer 26 that provides good electrostatic attraction while also retaining particles of process residues 30. The polymer layer 26 is desirably sufficiently thick to accommodate and retain process residues 30 that are pressed into the polymer layer 26 via the cleaning surface 28, while also being sufficiently thin to provide good electrostatic attraction between the cleaning wafer 22 and electrostatic chuck 108. A suitable thickness of the polymer layer 26 may be less than about 50 microns thick, such as from about 5 microns thick to about 50 microns thick, and even less than about 30 microns thick, such as from about 15 microns to about 20 microns thick.

Figure 2:
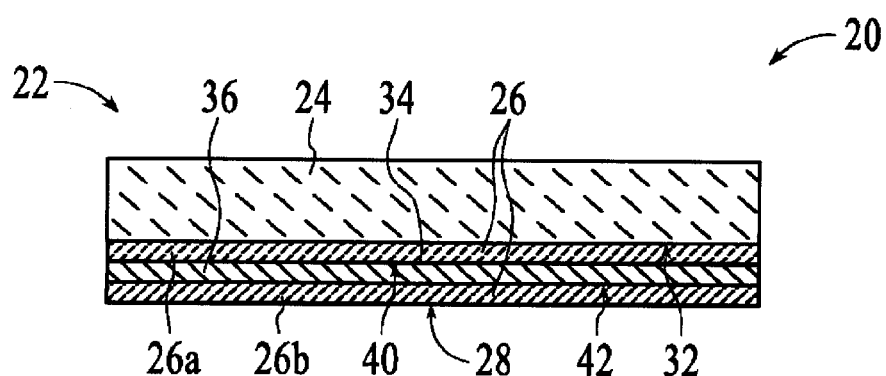
FIG. 2 is sectional side view of another embodiment of a cleaning wafer.

In another version, the electrostatic attraction of the cleaning wafer 22 to the electrostatic chuck 108 can be increased to improve cleaning of the support surface 180, by providing an electrode 34 about the polymer layer 26 as a part of the cleaning wafer 22, as shown for example in FIG. 2. A high chucking force is generated between electrode 34 and an electrode in the electrostatic chuck 108 that attracts the cleaning wafer 22 to the support surface 180, desirably with a force that is sufficient to embed the process residues 30 in the surface 28. For example, a voltage may be applied to an electrode 145 in the electrostatic chuck 108 while the cleaning wafer 22 is on the support surface 180, to generate electrostatic forces that electrostatically chuck the cleaning wafer 22 against the support surface 180. The electrode 34 comprises a conductive material that is capable of being electrically charged to generate the electrostatic forces, such as for example at least one of aluminum, copper, titanium, nickel, chromium and zirconium.

In one version, the electrode 34 is at least partially embedded in the polymer layer 26, as shown for example in FIG. 2. The electrode 34 can be formed by a suitable method, including deposition methods such as physical vapor deposition, electron vapor deposition, electroplating, screen printing and other methods as known to one of ordinary skill in the art. In one version, the electrode 34 comprises a metal layer 36, and may even comprise a mesh electrode or wire grid that is embedded in the polymer layer 26. In one version, the polymer layer 26 comprises first and second layers 26a,b of polymeric material. The first polymer layer 26a can be directly bonded to the disc 24 while the second polymer layer 26b comprises the cleaning surface 28. The electrode 34 is formed in between the two layers 26a,b on a bottom surface 40 of the first polymer layer 26a, and having the second polymer layer 26b formed on the electrode lower surface 42. The thickness of the second polymer layer 26b is desirably relatively thin to provide adequate electrostatic biasing of the electrode 34, such as a thickness of less than about 8 microns, and even a thickness of from about 2 to about 5 microns. The thickness of the first polymer layer 26a may be greater than that of the second polymer layer 26b, and may be at least about 10 microns, such as from about 10 to about 15 microns. A suitable thickness of the electrode 34 may be from about 200 angstroms to about 1000 angstroms.

In yet another version, the electrode 34 can comprise a relatively thin metal layer 36 that is formed on the cleaning surface 28 of the polymer layer 26 (not shown). The metal layer 36 is desirably sufficiently thin that process residues are able to push through the metal layer 36 to become embedded in the polymer layer 26. A suitable metal layer 36 may comprise a thickness of less than about 1000 angstroms and even less than about 500 angstroms, such as a thickness of from about 200 angstroms to about 500 angstroms. Upon electrostatic chucking, the metal layer 26 draws the bonded cleaning surface 28 towards the support surface 180, thereby pressing process residues into the polymer layer 26 to clean the support surface 180. Although preferred embodiments of the cleaning wafer 22 having the polymer layer 26 and electrode 34 are described and shown in FIG. 2, the cleaning wafer 22 may also comprise variations and combinations of these embodiments. For example, the cleaning wafer 22 may comprise more than one electrode 34 and can also comprise different arrangements of one or more polymer layers 26.

In still another version, the polymer layer 26 may comprise a resistivity that is sufficiently low to act as a relatively leaky dielectric that aids in the chucking of the cleaning wafer 22 against the support surface 180, and may also help in dissipating the chucking charge after cleaning. For example, a polymer layer 26 may be applied by a process that controls electrical properties of the polymer, such as the molecular connectivity of the polymer structure or polymer layer composition, to provide the desired lower resistivity. The polymer layer 26 may also be doped with an additive such as a metal, for example during the liquid precursor application process, to provide the desired resistivity. As another example, an additive comprising powdered graphite can be added to the liquid precursor to promote the conductivity of the polymer. In yet another example, the polymer layer 26 can comprise an ion implanted layer that is implanted with additives comprising metal ions to provide a higher conductivity. In one version, the polymer layer 26 may comprise a first layer 26a that has an additive that provides a desired lower resistivity, and a second layer 26b at the cleaning surface 28 that is substantially without the additive, to reduce contamination of the support surface 180 by the additive. A resistivity of the polymer layer 26 that may be sufficiently low to improve chucking of the cleaning wafer 22 against the support surface 180 may be a resistivity of less than about $10^{12}$ Ohms·cm, such as from about $10^6$ Ohms·cm to about $10^{12}$ Ohms·cm.

Figure 3:
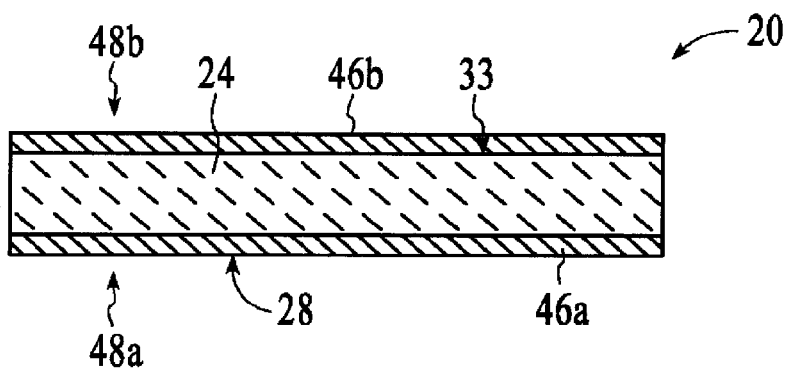
FIG. 3 is a sectional side view of yet another embodiment of a cleaning wafer.

In yet another version, a cleaning wafer 22 to clean process residues from a support surface 180 comprises a soft metal layer 46a with a metal cleaning surface 28 that is capable of picking up and retaining residues 30 from the surface 180 to clean the surface 180, as shown for example in FIG. 3. This version may be particularly advantageous for cleaning supports 100 in process chambers 106 in which very high temperatures are maintained that may not desirable for the polymer layer 26, such as temperatures above 400° C., and even above about 450° C. In this version, the soft metal layer 46a is formed on first side 48a of the disc 24, such as on the bottom surface 32 of the disc 24. A second metal layer 46b can also desirably be formed on the opposing side 48b of the disc 24, such as on the top surface 33 of the disc 24. The second metal layer 46b reduces the incidence of bowing or warping of the disc 24, which could otherwise arise from thermal expansion mismatch between the first soft metal layer 46a and the disc 24. Alternatively, the cleaning wafer 22 can be absent the second metal layer 46b. The soft metal layer 46a desirably comprises a relatively small thickness that is sufficient to retain the process residues 30 on the cleaning surface 28. For example, the soft metal layer 46a may comprise a thickness of from about 1 micrometer to about 10 micrometers. The second metal layer 46b may comprise the same or a substantially similar thickness, and desirably comprises the same composition as the first metal layer 46a.

The soft metal layer 46a comprises one or more metals that are sufficiently soft to embed residues 30 in the cleaning surface 28. For example, the metal layers 46a,b may comprise at least one of aluminum, copper and indium. The metal layer composition is desirably also selected with respect to metal contamination considerations. For example, an aluminum cleaning layer 46a may be provided in an aluminum deposition chamber, whereas a copper cleaning layer 46a may be provided in a copper deposition chamber. Thus, the cleaning wafer 22 comprising the metal layers 46a,b provides for the cleaning of residues 30 from support surfaces 180 even at higher temperatures.

In one version of a method of cleaning a support surface 180 with the cleaning wafer 22, the cleaning wafer 22 is placed on the support surface 180 of an electrostatic chuck 108 inside a substrate processing chamber 106. Gases in the chamber 106 are exhausted by pumping down to a vacuum pressure, such as a pressure of about $10^{-7}$ barr ($9.8 \times 10^{-7}$ atm), to remove potential contaminants from the chamber 106. A temperature in the chamber 106, such as a temperature of the substrate support 100, may be maintained at from about 25° C. to about 400° C. A voltage is then applied from an electrode supply 143 to the electrode 145 in the electrostatic chuck 108 to press the cleaning surface 28 of the cleaning wafer 22 against the support surface 180. In one version, the voltage is a DC voltage, such as a DC voltage of at least about 200 Volts, and even from about 200 to about 1000 Volts, such as from about 500 Volts to about 600 Volts. The voltage may also comprise, for example, an RF voltage. After a duration that is sufficient to adhere the residues 30 to the cleaning surface 28, such as for example from about 0.5 minutes to about 5 minutes, the voltage is shut off. Alternatively, for a support 100 comprising a vacuum chuck, a vacuum pressure is applied that generates vacuum pressure forces on the cleaning surface 28 that pull the cleaning surface 28 into the vacuum chuck support surface 180, and the cleaning wafer 22 is vacuum held on the chuck for a sufficient time to clean the surface 180. The cleaning wafer 22 is removed from the support surface 180 along with the residues 30 adhered to the wafer 22, to clean the support surface 180 of the process residues 30. The cleaning process can be repeated as needed, and can also be combined with other cleaning steps, such as energized gas cleaning steps, to provide the desired removal of process residues.

The cleaning wafer 22 comprising the polyimide layer 26 formed by directly applying the liquid polyimide precursor provides improved cleaning over other cleaning methods, such as methods of cleaning with wafers that have multiple layers or adhesive layers, by providing good high temperature and high vacuum performance substantially without contaminating or damaging the support surface 180. Accordingly, the improved cleaning wafer 22 allows for improved process performance and longer component life-time for substrate supports 100 such as electrostatic chucks 108.

Figure 4:
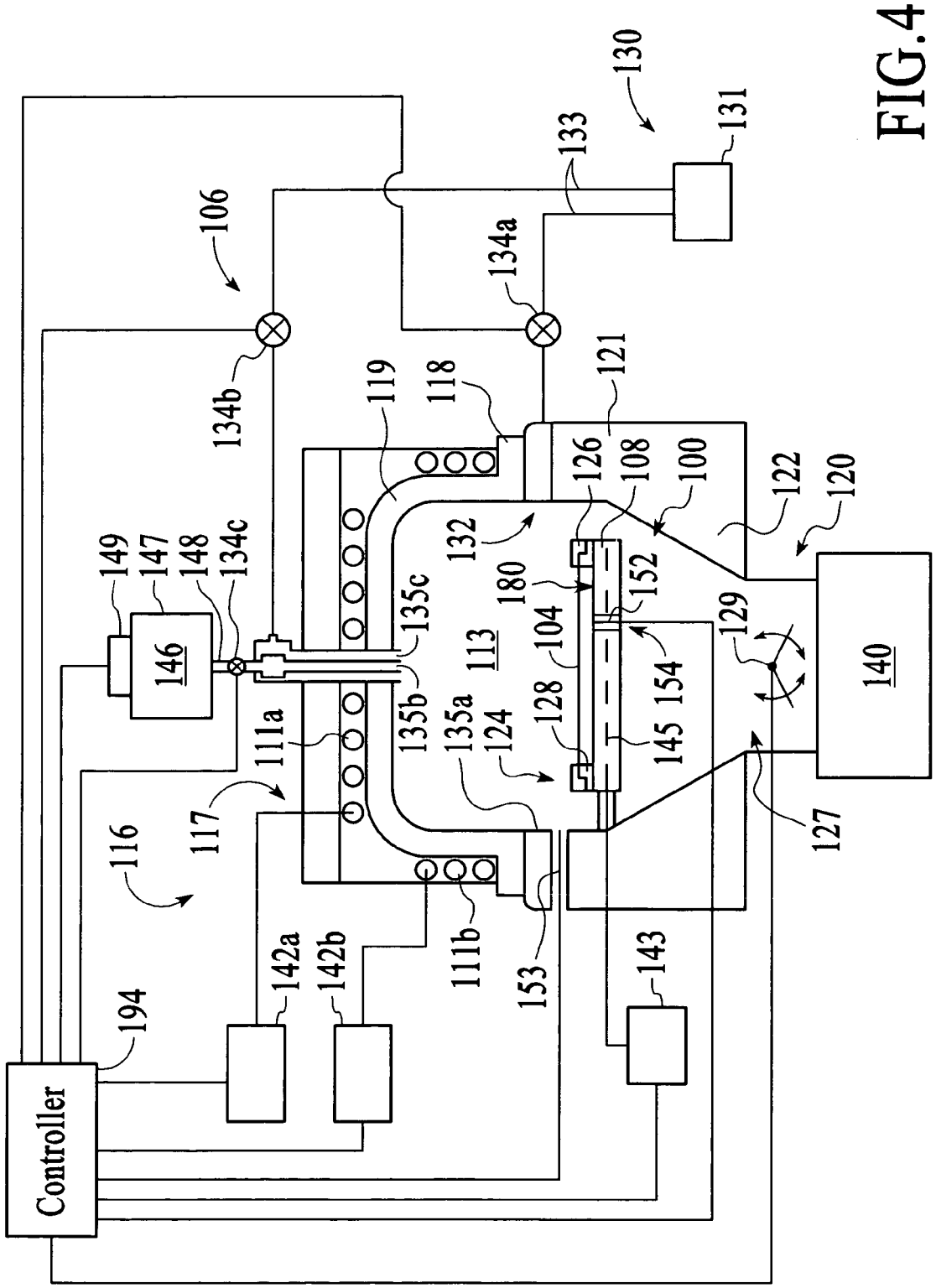
FIG. 4 is a sectional side view of an embodiment of a chemical vapor deposition chamber having a support surface that can be cleaned by a cleaning wafer.

In one version, the cleaning wafer 22 cleans a support surface 180 that is a part of a process chamber 106 that is capable of performing a chemical vapor deposition process such as an HDP-CVD chamber, an embodiment of which is shown in FIG. 4. A version of an HDP-CVD chamber is also described in U.S. Pat. No. 6,559,026 to Rossman et al, issued May 6, 2003, which is herein incorporated by reference in its entirety. The HDP-CVD chamber shown in FIG. 4 comprises enclosure walls 118, which may comprise a ceiling 119, sidewalls 121, and a bottom wall 122 that enclose a process zone 113. The enclosure walls 118 can comprise a domed ceiling 119 over the process zone 113. A deposition gas can be introduced into the chamber 106 through a gas supply 130 that includes a deposition gas source 131, and a gas distributor 132. In the version shown in FIG. 4, the gas distributor 132 comprises one or more conduits 133 having one or more gas flow valves 134a,b and one or more gas outlets 135a around a periphery of the substrate 104, as well as one or more outlets 135b,c above the substrate 104 to provide an optimized flow of deposition gas in the chamber 106. The deposition gas can comprise, for example, one or more of $SiH_4$ and $O_2$. An electrode 145 in an electrostatic chuck 108 of a substrate support 100 may be powered by an electrode power supply 143 to electrostatically hold a substrate on the support surface 180 during processing, or to press the cleaning surface 28 of a cleaning wafer 22 against the support surface 180 during cleaning of the surface 180. Spent process gas and process byproducts are exhausted from the chamber 106 through an exhaust 120 which may include an exhaust conduit 127 that receives spent process gas from the process zone 113, a throttle valve 129 to control the pressure of process gas in the chamber 106, and one or more exhaust pumps 140.

In one version, the support 100 also comprises a process kit 124 comprising one or more rings, such as a cover ring 126 and a collar ring 128 that covers at least a portion of the upper surface of the support 100 to inhibit erosion of the support 100. In one version, the collar ring 128 at least partially surrounds the substrate 104 to protect portions of the support 100 not covered by the substrate 104. The cover ring 126 encircles and covers at least a portion of the collar ring 128, and reduces the deposition of particles onto both the collar ring 128 and the underlying support 100. A lift pin assembly 154 and substrate transport 153 can also be provided to position the substrate 104 on a substrate receiving surface 180 of the support 100. The lift pin assembly 154 comprises a plurality of lift pins 152 adapted to contact the underside of the substrate 104 to lift and lower the substrate 104 onto the substrate receiving surface 180. The substrate transport 153 is adapted to transport substrates 104 in and out of the process chamber 106.

In one version, the deposition gas may be energized to process the substrate 104 by a gas energizer 116 comprising an antenna 117 having one or more inductor coils 111a,b which may have a circular symmetry about the center of the chamber to couple energy to the process gas in the process zone 113 of the chamber 106. For example, the antenna 117 may comprise a first inductor coil 111a about a top portion of the domed ceiling 119 of the chamber 106, and a second inductor coil 111b about a side portion of the domed ceiling 119. The inductor coils may be separately powered by first and second RF power supplies 142a,b. The gas energizer 116 may also comprise one or more process electrodes that may be powered to energize the process gas. A remote chamber 147 may also be provided to energize a process gas, such as a cleaning gas, in a remote zone 146. The process gas can be energized by a remote zone power supply 149, such as a microwave power supply, and the energized gas can be delivered via a conduit 148 having a flow valve 134c to the chamber 106, for example to clean the chamber.

To process a substrate 104, the process chamber 106 is evacuated and maintained at a predetermined sub-atmospheric pressure. The substrate 104 is then provided on the support 100 by a substrate transport 153, such as for example a robot arm, and lift pin assembly 154. The substrate 104 may be held on the support 100 by applying a voltage to an electrode in the support 100 via an electrode power supply 143. The gas supply 130 provides a process gas to the chamber 106 and the gas energizer 116 couples RF or microwave energy to the process gas to energize the gas to process the substrate 104. Effluent generated during the chamber process is exhausted from the chamber 106 by the exhaust 120.

The chamber 106 can be controlled by a controller 194 that comprises program code having instruction sets to operate components of the chamber 106 to process substrates 104 in the chamber 106. For example, the controller 194 can comprise a substrate positioning instruction set to operate one or more of the substrate support 100 and substrate transport 153 and lift pins 152 to position a substrate 104 or cleaning wafer 22 in the chamber 106; a gas flow control instruction set to operate the gas supply 130 and flow control valves to set a flow of gas to the chamber 106; a gas pressure control instruction set to operate the exhaust 120 and throttle valve to maintain a pressure in the chamber 106; a gas energizer control instruction set to operate the gas energizer 116 to set a gas energizing power level; a temperature control instruction set to control temperatures in the chamber 106; a cleaning control instruction set to set a voltage applied to the electrode 145 to generate an electrostatic force to press the cleaning wafer 22 against the support surface 180; and a process monitoring instruction set to monitor the process in the chamber 106.

Although exemplary embodiments of the present invention are shown and described, those of ordinary skill in the art may devise other embodiments which incorporate the present invention, and which are also within the scope of the present invention. For example, other polymer layer and electrode compositions and arrangements may be provided other than those specifically shown. Also, the cleaning wafer 22 may clean support surfaces 180 in process chambers other than that described. Furthermore, relative or positional terms shown with respect to the exemplary embodiments are interchangeable. Therefore, the appended claims should not be limited to the descriptions of the preferred versions, materials, or spatial arrangements described herein to illustrate the invention.

What is claimed is:

1. A cleaning wafer to clean process residues from a support surface used in the processing of a substrate in an energized gas, the cleaning wafer comprising:
    a disc comprising
        (i) a supporting material comprising aluminum oxide, quartz, silicon wafer, polycarbonate, aluminum, aluminum alloy, stainless steel, or titanium; and
        (ii) a polymer layer supported by the supporting material, the polymer layer having:
            (a) a thickness of less than about 50 microns,
            (b) a resistivity of from about $10^6$ to about $10^{12}$ Ohms·cm,
            (c) a cleaning surface, and
            (d) a metal layer at least partially embedded in, or on the surface of, the polymer layer, and
        whereby pressing the cleaning surface of the cleaning wafer against the support surface causes the process residues on the support surface to adhere to the cleaning surface of the cleaning wafer such that the process residues are lifted off and cleaned from the support surface upon removal of the cleaning wafer therefrom.

2. A cleaning wafer according to claim 1 wherein the polymer layer comprises a spin-coated layer.

3. A cleaning wafer according to claim 1 wherein the polymer layer comprises a sprayed layer.

4. A cleaning wafer according to claim 1 wherein the disc comprises a silicon disc having a surface comprising less than about $5 \times 10^{11}$ atoms/cm$^2$ of contaminant metal.

5. A cleaning wafer according to claim 1 wherein the metal layer comprises an electrode that is capable of being electrically charged to generate electrostatic forces that press the cleaning surface against the support surface.

6. A cleaning wafer according to claim 5 wherein the electrode comprises a thickness of from about 200 angstroms to about 1000 angstroms.

7. A cleaning wafer according to claim 5 wherein the electrode comprises a mesh electrode.

8. A cleaning wafer according to claim 1 wherein the cleaning wafer comprises a periphery to fit the periphery of the support surface.

9. A cleaning wafer according to claim 1 wherein the cleaning surface is shaped to match a contour of the support surface.

10. A cleaning wafer to clean process residues from a support surface used in the processing of a substrate in an energized gas, the cleaning wafer comprising:
   (a) a disc having a polymer layer comprising a cleaning surface; and
   (b) an electrode that is at least partially embedded in the polymer layer, the electrode capable of being electrically charged to generate electrostatic forces to press the cleaning surface against the support surface,
   whereby pressing the cleaning surface of the cleaning wafer against the support surface causes the process residues on the support surface to adhere to the cleaning surface of the cleaning wafer such that the process residues are lifted off and cleaned from the support surface upon removal of the cleaning wafer therefrom.

11. A cleaning wafer according to claim 10 wherein the polymer layer comprises polyimide.

12. A cleaning wafer according to claim 10 wherein the polymer layer comprises first and second polyimide layers, and wherein the electrode is embedded therebetween.

13. A cleaning wafer according to claim 10 wherein the electrode comprises a metal layer on the cleaning surface, the metal layer having a thickness of less than about 1000 angstroms.

14. A cleaning wafer according to claim 10 wherein the polymer layer has a resistivity of from about $10^6$ to about $10^{12}$ Ohms·cm.

15. A cleaning wafer according to claim 10 wherein the electrode comprises a thickness of from about 200 angstroms to about 1000 angstroms.

16. A cleaning wafer according to claim 10 wherein the electrode comprises a mesh electrode.

17. A cleaning wafer according to claim 10 wherein the polymer layer is formed on the disc by applying a liquid polyimide precursor to the disc.

18. A cleaning wafer according to claim 17 wherein polymer layer comprises a spin-coated or sprayed layer.

19. A cleaning wafer according to claim 10 wherein the cleaning wafer comprises a periphery to fit the periphery of the support surface.

20. A cleaning wafer according to claim 10 wherein the cleaning surface is shaped to match a contour of the support surface.

21. A cleaning wafer to clean process residues from a support surface used in the processing of a substrate in an energized gas, the cleaning wafer comprising:
   (a) a silicon disc; and
   (b) a polymer layer on the silicon disc, the polymer layer having a thickness of less than about 50 microns and a cleaning surface; and
   (c) a metal layer that is at least partially embedded in, or on the surface of, the polymer layer.

22. A cleaning wafer according to claim 21 wherein the polymer layer has a resistivity of from about $10^6$ to about $10^{12}$ Ohms·cm.

23. A cleaning wafer according to claim 21 wherein the polymer layer comprises polyimide.

24. A cleaning wafer according to claim 21 wherein the metal layer comprises an electrode that is capable of being electrically charged to generate electrostatic forces that press the cleaning surface against the support surface.

25. A cleaning wafer according to claim 24 wherein the electrode comprises a thickness of from about 200 angstroms to about 1000 angstroms.

26. A cleaning wafer according to claim 24 wherein the electrode comprises a mesh electrode.

27. A cleaning wafer according to claim 21 wherein the cleaning wafer comprises a periphery to fit the periphery of the support surface.

28. A cleaning wafer according to claim 21 wherein the cleaning surface is shaped to match a contour of the support surface.

29. A cleaning wafer to clean process residues from a support surface used in the processing of a substrate in an energized gas, the cleaning wafer comprising:
   (a) a silicon wafer; and
   (b) a polymer layer on the silicon wafer, the polymer layer having:
      (i) a thickness of less than about 50 microns;
      (ii) a metal layer least partially embedded in, or on the surface of, the polymer layer; and
      (iii) a cleaning surface,
   whereby pressing the cleaning surface of the cleaning wafer against the support surface causes the process residues on the support surface to adhere to the cleaning surface of the cleaning wafer such that the process residues are lifted off and cleaned from the support surface upon removal of the cleaning wafer therefrom.

30. A cleaning wafer according to claim 29 further comprising a periphery to fit the periphery of the support surface.

31. A cleaning wafer according to claim 29 wherein the cleaning surface is shaped to match a contour of the support surface.

32. A cleaning wafer according to claim 29 wherein the polymer layer has a resistivity of from about $10^6$ to about $10^{12}$ Ohms·cm.

33. A cleaning wafer according to claim 29 further comprising an electrode that is at least partially embedded in the polymer layer, the electrode being capable of being electrically charged to generate electrostatic forces that press the cleaning surface against the support surface.

34. A cleaning wafer according to claim 33 wherein the electrode comprises a thickness of from about 200 angstroms to about 1000 angstroms.

35. A cleaning wafer according to claim 29 whereby the cleaning surface comprises less than about $5 \times 10^{11}$ atoms/cm$^2$ of contaminant metal.

* * * * *